United States Patent
Ko et al.

(10) Patent No.: US 8,350,468 B2
(45) Date of Patent: Jan. 8, 2013

(54) ORGANIC ELECTROLUMINESCENCE DISPLAY INCLUDING A SPACER AND METHOD FOR FABRICATING THE SAME

(75) Inventors: Jung-Woo Ko, Suwon-si (KR);
Sang-Shin Lee, Suwon-si (KR);
Sang-Soo Park, Suwon-si (KR);
Taek-Kyo Kang, Suwon-si (KR);
Seung-Ju Hong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 170 days.

(21) Appl. No.: 12/489,167

(22) Filed: Jun. 22, 2009

(65) Prior Publication Data
US 2010/0033084 A1 Feb. 11, 2010

Related U.S. Application Data

(60) Provisional application No. 61/077,052, filed on Jun. 30, 2008.

(51) Int. Cl.
*H01J 1/62* (2006.01)

(52) U.S. Cl. ........................................ 313/506; 313/504

(58) Field of Classification Search ........... 313/498–512
See application file for complete search history.

(56) References Cited

U.S. PATENT DOCUMENTS

| | | | |
|---|---|---|---|
| 7,319,290 B2 * | 1/2008 | Chu et al. ...................... | 313/506 |
| 2003/0227253 A1 * | 12/2003 | Seo et al. ...................... | 313/504 |
| 2005/0035708 A1 * | 2/2005 | Yamazaki et al. ............ | 313/505 |
| 2005/0258741 A1 * | 11/2005 | Kim et al. ..................... | 313/503 |

FOREIGN PATENT DOCUMENTS

| | | |
|---|---|---|
| JP | 2001-035420 | 2/2001 |
| JP | 2006-054145 | 2/2006 |
| KR | 10-2002-0037608 | 5/2002 |
| KR | 10-2005-0094151 | 9/2005 |

* cited by examiner

*Primary Examiner* — Bumsuk Won
(74) *Attorney, Agent, or Firm* — Knobbe Martens Olson & Bear LLP

(57) ABSTRACT

Embodiments of the present disclosure provide an organic electroluminescence display device. The display device may include a set of multi-directional spacers that are interposed between the pixels of the display. In one embodiment, the spacers are positioned in both lengthwise and crosswise directions. In another embodiment, the spacers include a first portion that is extends lengthwise between pixels and one or more portions that extend laterally from the first portion between pixels. In yet another embodiment, the spacers include portions that extend in multiple directions between pixels. The spacers may substantially surround each of the pixels and may serve as a boundary, for example, that prevents organic material for one pixel from being incorrectly deposited in another pixel. The spacers can be configured as a support structure, such as, for a metal mask during fabrication of the display device. In addition, the multi-directional aspect of the spacers may be useful in protecting the pixels from damage, such as, when a metal mask is moved during mounting or during fabrication of the display device.

18 Claims, 5 Drawing Sheets

ORGANIC ELECTROLUMINESCENCE DISPLAY INCLUDING A SPACER AND METHOD FOR FABRICATING THE SAME

CROSS-REFERENCE TO RELATED APPLICATIONS

This application claims priority to U.S. Provisional Application No. 61/077,052, filed on Jun. 30, 2008, and entitled "Organic Electroluminescence Display Including a Spacer and Method for Fabricating the Same," which is herein incorporated by reference in its entirety.

BACKGROUND

1. Field

The present disclosure relates to an organic light emitting diode (OLED) having one or more spacers. More particularly, it relates to an OLED having spacers having dimensions sufficient to prevent organic material intended for a pixel region from leaking or invading into other pixel regions during deposition of the organic material. In addition, the present disclosure may relate to an OLED having spacers that provide an improved mounting structure for a mask used during fabrication of the OLED.

2. Description of the Related Art

An organic light emitting diode (OLED) is a device that includes an organic emission layer (organic EML), which is interposed between an anode and a cathode. When a voltage is applied across the anode and cathode, electrons and holes are injected into the organic EML and recombine to produce excitons. These excitons eventually transition from an excited state to a ground state and light is emitted from the EML as a result. This enables an OLED to operate without the need of an external light source. Accordingly, OLEDs can be fabricated into displays that are lighter and/or thinner than previous technologies, such as liquid crystal displays (LCDs).

During fabrication of an OLED display, the matrix of pixels for the display is deposited using a fine metal mask. The mask defines the region of the pixel in which the organic EML is deposited. In order to prevent impingement of the metal mask onto the underlying substrate, spacers are usually provided as a support structure for the fine metal mask. The spacers, however, tend to be sparsely spaced among the pixels and tend to have a relatively small area.

Unfortunately, even with the use of the fine metal mask, material for the organic EML of one pixel can invade into the regions of other pixels. This may occur, for example, due to a deposition shadow during the deposition of the organic EML. In addition, conventional spacers typically provide a limited support structure and it can be difficult to mount the fine metal mask on conventional spacers. Fine metal masks often get caught or snagged by the spacer during mounting or transport of the mask.

SUMMARY

Embodiments of the present disclosure provide an OLED display device and method of fabricating an OLED display device. The display device may include a set of multi-directional spacers that are interposed between the pixels of the display. In one embodiment, the spacers are positioned in both lengthwise and crosswise directions. In another embodiment, the spacers include a first portion that is extends lengthwise between pixels and one or more portions that extend laterally from the first portion between pixels. In yet another embodiment, the spacers include portions that extend in multiple directions between pixels. The spacers can be configured as a support structure, such as, for a metal mask during fabrication of the display device. In addition, the multi-directional aspect of the spacers may be useful in protecting the pixels from damage, such as when a metal mask is moved during fabrication of the display device.

In one embodiment, an organic light emitting device may comprise: a substrate; an array of organic light emitting pixels disposed over the substrate; and a plurality of spacers. The spacers have portions extending in a plurality of directions between the pixels. Portions of the spacers are positioned along a lengthwise side of the pixels and are between pixels of different color. These portions are also at least as long as the length of the pixels.

In another embodiment, an organic light emitting device may comprise: a substrate; and a plurality of spacers between each of the pixels. The spacers may have portions that extend in a plurality of directions and may comprise a first portion that extends lengthwise along the pixels and having a length that is at least as long as a plurality of individual pixels. A plurality of other portions is provided and extends laterally from the first portion between the pixels.

In another embodiment, an organic light emitting device may comprise: a substrate; an array of organic light emitting polygon-shaped pixels disposed over the substrate; and a plurality of spacers between each of the pixels. The spacers may have portions that extend in a plurality of directions between pixels and the portions are at least as long as the side of pixel to which it is adjacent.

In another embodiment, a method of fabricating an organic light emitting device may comprise: providing a substrate; providing a set of spacers having portions that extend in a plurality of directions between pixels, wherein some of the portions are at least long as a side of the pixels; mounting a mask on the set of spacers, wherein the mask defines areas in the pixels that are targeted for organic material; and depositing organic material for the pixels based on the mounted mask, wherein the set of spacers substantially prevents organic material for one of the pixels from invading into another pixel.

BRIEF DESCRIPTION OF THE DRAWINGS

The above and other features of the present disclosure will be described in reference to certain exemplary embodiments thereof with reference to the attached drawings in which.

DETAILED DESCRIPTION OF SOME EMBODIMENTS

Some embodiments of the present disclosure will be described below with reference to the accompanying drawings, in which exemplary embodiments of the disclosure are shown. This disclosure may, however, be embodied in different forms and should not be construed as limited to the embodiments set forth herein.

Figure 1:
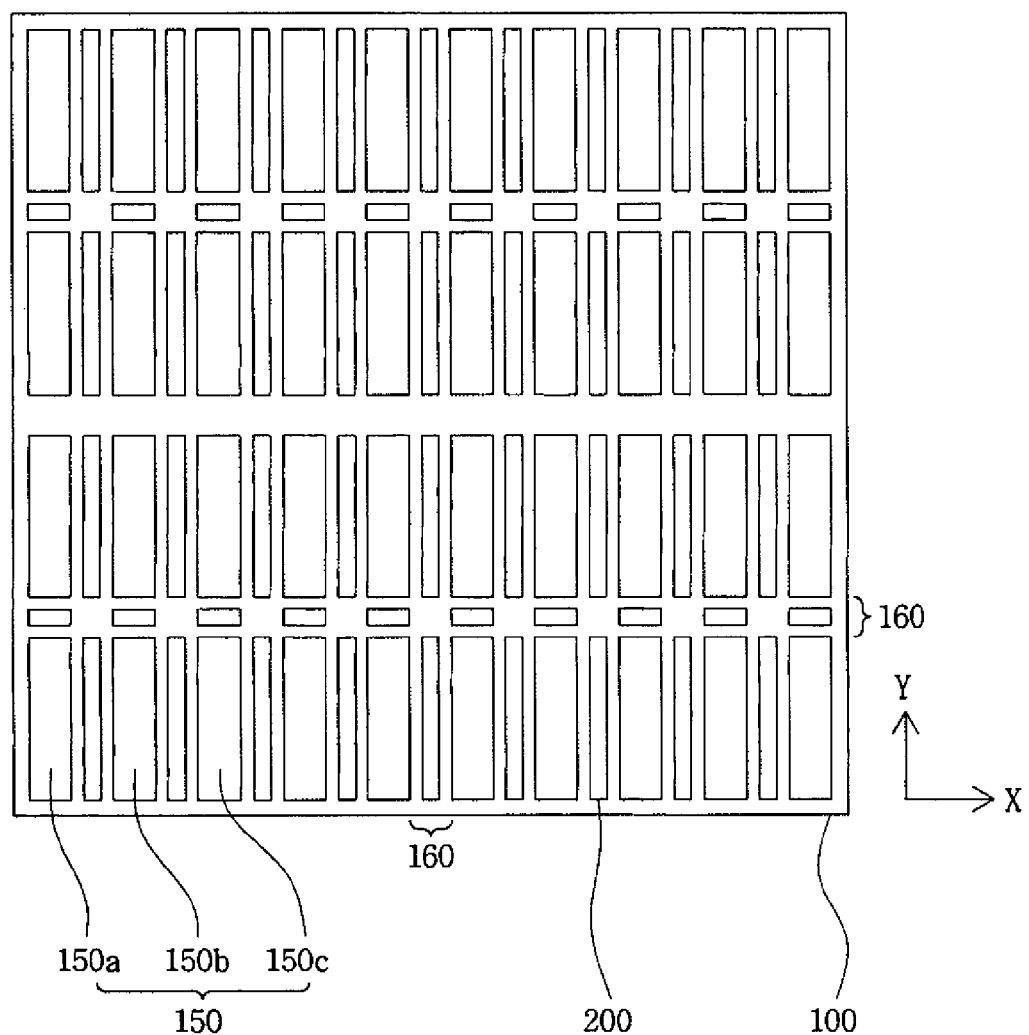
FIG. 1 illustrates the layout of a pixel region of an organic light emitting diode (OLED) according to an exemplary embodiment of the present disclosure.

FIG. 1 illustrates the layout of a pixel region of an organic light emitting diode (OLED) according to an exemplary embodiment of the present disclosure. As shown, a display device may comprise a substrate 100 having various pixel regions 150, non-pixel regions 160, and spacers 200.

The pixel regions 150 may be pixels of various colors. For example, the pixel regions 150 may include red (R) pixels 150a, green (G) pixels 150b, and blue (B) pixels 150c.

The pixel regions may be surrounded by non-pixel regions 160, such as, peripheral non-pixel regions around each of the pixels 150a, 150b, and 150c. An insulating layer (not shown) can also be disposed on the non-pixel regions 160. The insulating layer may, for example, be used as a pixel defining layer. The insulating layer may be formed of materials, such as, acrylic resin, benzocyclobutene (BCB), and polyimide (PI).

Spacers 200 may also be disposed in between the pixel regions 150 in both a lengthwise direction (Y-axis) and a widthwise direction (X-axis). For example, as shown spacers 200 may comprise portions that extend lengthwise between pixels 150, such as lengthwise between pixels 150a and 150b, and separate portions that extend crosswise (e.g., along the X-axis) between pixels 150.

In some embodiments, the lengthwise portions of spacers 200 may span a length at least as long as the length of one of pixel regions 150. In addition, the crosswise portions spacers 200 may span a width as least as wide as the width of one of pixel regions 150. As shown, these various portions of spacers 200 may have gaps between them and the pixels 150.

The spacers 200 may be formed using a photolithography process. In particular, the spacers 200 may be formed by coating an organic material or a mixture of organic and inorganic materials and patterning the coated material using exposure and development processes known to those skilled in the art.

In some embodiments, as shown, the spacers 200 are configured to substantially surround or encapsulate the individual pixels of pixel regions 150. These types of spacers may be useful for several reasons. For example, during fabrication, a fine metal mask may be mounted on the spacers 200 to define areas targeted for organic EML material. The organic EML is then deposited based on the mask to form the matrix of the pixel regions 150, and thereby forming R. G. and B EMLs on the R. G. and B pixel regions 150a, 150b, and 150c, respectively. Subsequently, a second electrode (not shown) may be formed over pixel regions 150a, 150b, and 150c to complete the fabrication of the OLED display device.

Because, in some embodiments, the spacers 200 substantially surround individual pixels, they can prevent organic EML material for one pixel region from invading an adjacent or other pixel region, for example, during deposition. This phenomenon may occur, for example, as the result of a deposition shadow from the mask. Also, the spacers 200 may provide an easier or larger surface to which the fine metal mask can be mounted. Furthermore, the spacers 200 of some embodiments may be able prevent or reduce instances where the fine metal mask is snagged or caught while being mounted or moved.

Figure 2A:
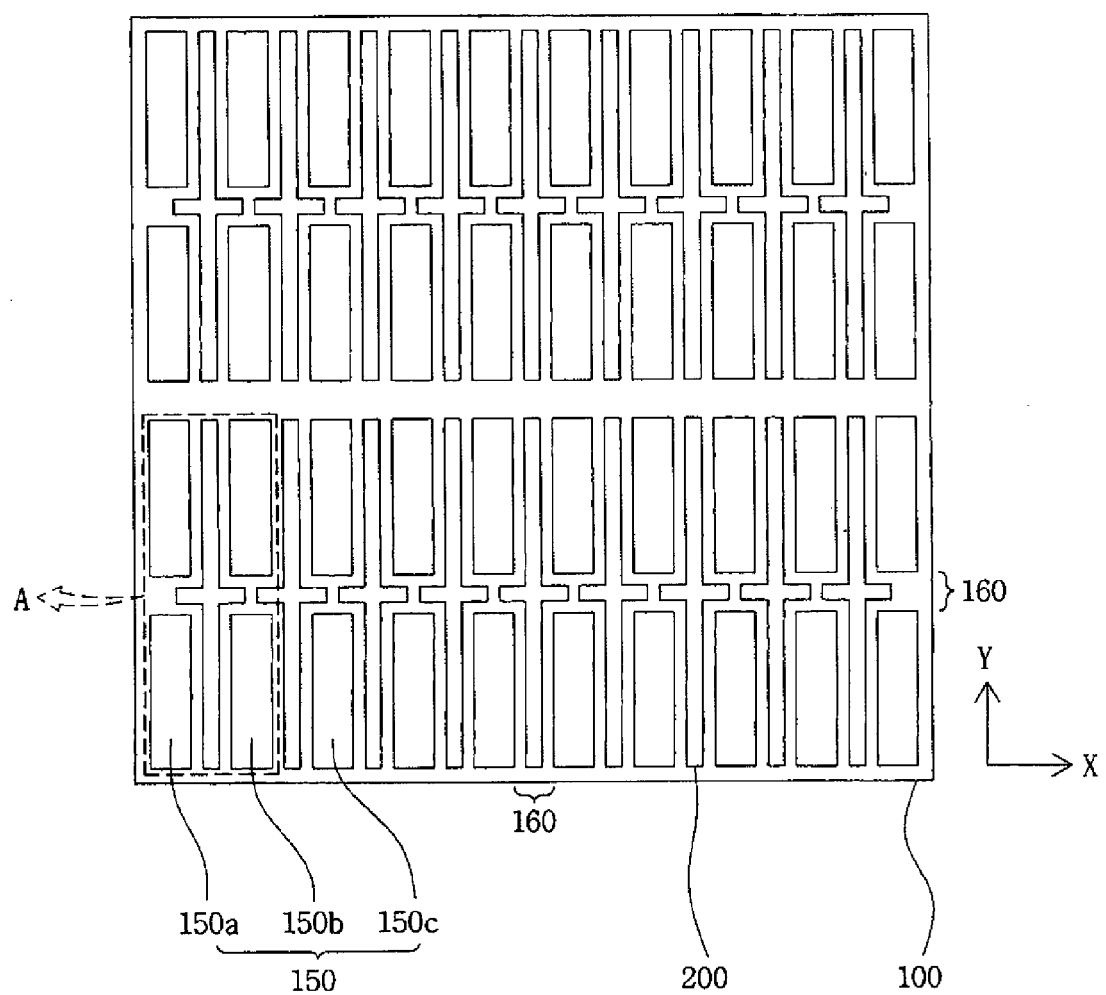
FIG. 2A illustrates the layout of a pixel region of an OLED according to another exemplary embodiment of the present disclosure.

FIG. 2A illustrates the layout of an OLED according to another exemplary embodiment of the present disclosure. As shown, spacers 200 may have generally cross-shaped radial structure. In particular, as shown in highlighted region A, a spacer may have a cross-shaped radial structure having a main or lengthwise portion (e.g., along the Y-axis) and lateral portions (e.g., along the X-axis) that extend from the lengthwise portion. In this case, the length of the lengthwise portion of spacer 200 may be equal to or greater than the length of a plurality of individual pixels, such as a length of approximately two pixels.

As shown, the pixels may have a rectangular shape. The first direction of the spacer 200 may correspond to a major axis of the pixel and the second direction of the spacer 200 may correspond to a minor axis of the pixel. In some embodiments, the crosswise portions extend substantially across the width of the pixels to the next spacer 200. One skilled in the art will recognize that spacers may have crosswise portions that allow for gaps or discontinuous portions between each other.

As noted, the spacers 200 may be formed using a photolithography process known to those skilled in the art. For example, the formation of the spacer 200 may include coating an organic material or a mixture of organic and inorganic materials and patterning the coated material using known exposure and developing processes.

When the spacers 200 have a cross-shaped radial structure, this structure may provide an improved mounting surface for the metal mask and may also prevent organic EML from invading adjacent pixels due to a deposition shadow of the mask during deposition of the material for the organic EML. Also, the metal mask may be mounted on the spacers 200 more easily and stably.

When the spacers 200 have the radial structure, another feature of this structure is that the metal mask may be caught or snagged less frequently during transportation of the metal mask to another pixel region in comparison to other types of spacers, which generally are formed in only a widthwise direction. Although pixels with rectangular shapes have been described, embodiments of the present disclosure may be implemented with any shape of pixels. In particular, the spacers 200 may be modified and variously applied according to the shape or arrangement of the pixels.

Figure 2B:
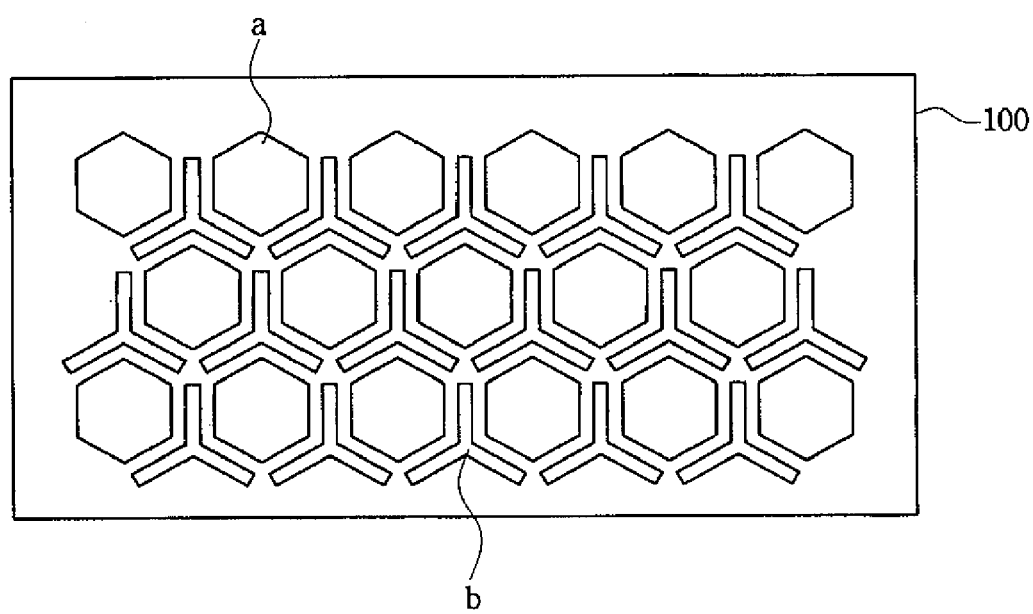
FIG. 2B illustrates the layout of spacers when a pixel region has a polygonal shape.

FIG. 2B illustrates the layout of spacers for polygonal-shaped pixels, such as hexagon-shaped pixels. One skilled in the art will recognize, however, that other shapes of pixels may be implemented, such as octagon-shaped pixels. For purposes of illustration, an embodiment using hexagon-shaped pixels will now be described.

As shown, spacers may have portions that extend in a plurality of directions between the pixels "a". For example, as shown in FIG. 2B, a pixel "a" may have a hexagonal shape, and thus, spacers "b" may portions that extend in first, second, and third directions.

For example, the spacer "b" may have a radial structure having branches extending along sides of a plurality of adjacent pixels "a" from a portion around which corners of the adjacent pixels meet. Also, the first-, second-, and third-directional branches of the spacer "b" are respectively positioned along the sides of their respective pixels.

As shown, a plurality of spacers "b" may be provided such that each of the pixels are substantially encapsulated or surrounded. By surrounding the pixels, the spacers may thus help to prevent failures during deposition of organic EMLs in the pixels or failures that occur during the mounting or transportation of the metal mask.

Figure 3:
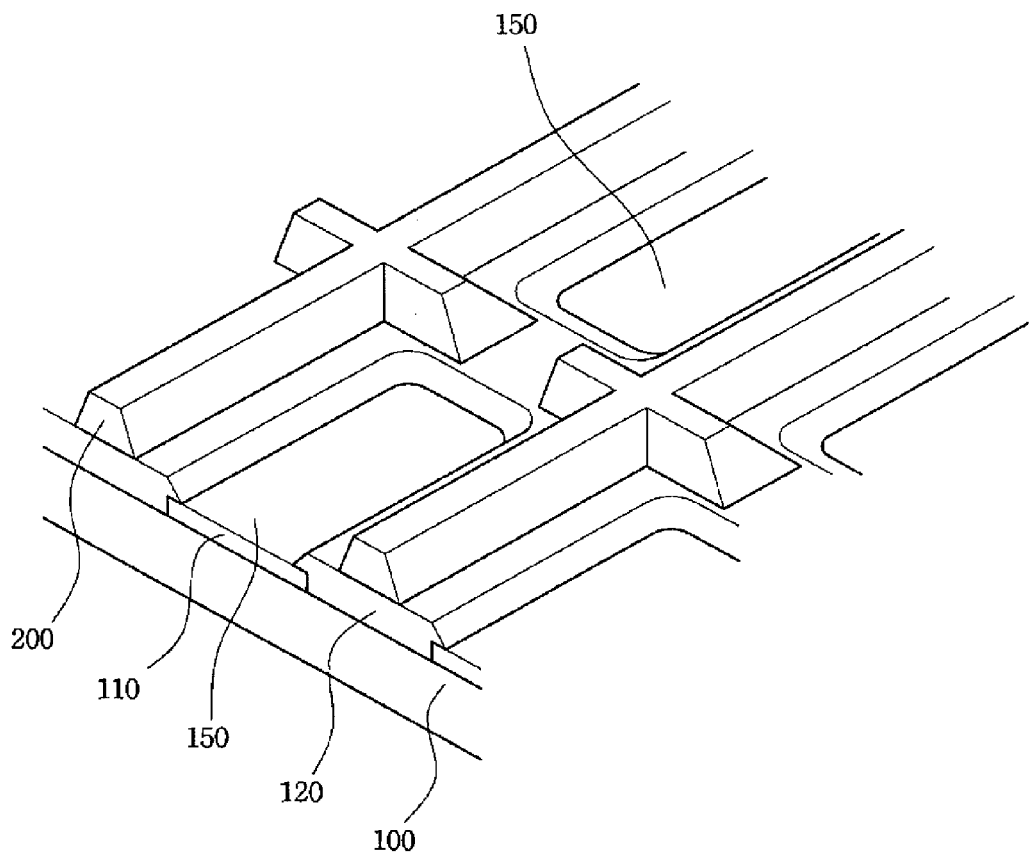
FIG. 3 is a perspective view of the OLED shown in FIG. 2A.

FIG. 3 is a perspective view of the OLED shown in FIG. 2A. As shown, in a pixel 150, a first electrode 110 is formed on a substrate 100. An insulating layer 120 is also shown that separates pixel regions 150 from one another. The insulating layer 120 may be a pixel defining layer, which may be formed from materials, such as acrylic resin, BCB, and PI.

As noted above with reference to FIG. 2A, the spacer 200 may have a cross-shaped radial structure with a lengthwise portion that extends lengthwise between pixels 150 and a crosswise portions that extend from the lengthwise portion. As shown, the spacer 200 may have a tapered cross section. This type of cross section may be advantageous in helping ease the mounting of the metal mask. Of course, one skilled in the art will recognize that spacer 200 may be configured with other types of cross sections, such as square, rectangular, etc. In addition, the spacer 200 is shown with a relatively flat top surface. One skilled in the art will recognize that spacer 200 may have concave or convex top surfaces depending on the desired characteristics of spacer 200.

As noted, during fabrication of the device 100, a metal mask is mounted on the spacer 200, and a material for organic EMLs is deposited on the pixel region 150, thereby forming organic EMLs. In this case, R. G. and B organic EMLs are formed in the R. G. and B unit pixels, respectively. Subsequently, a second electrode (not shown) is formed on the substrate 100 having the spacers 200, thereby completing fabrication of the OLED.

Figure 4:
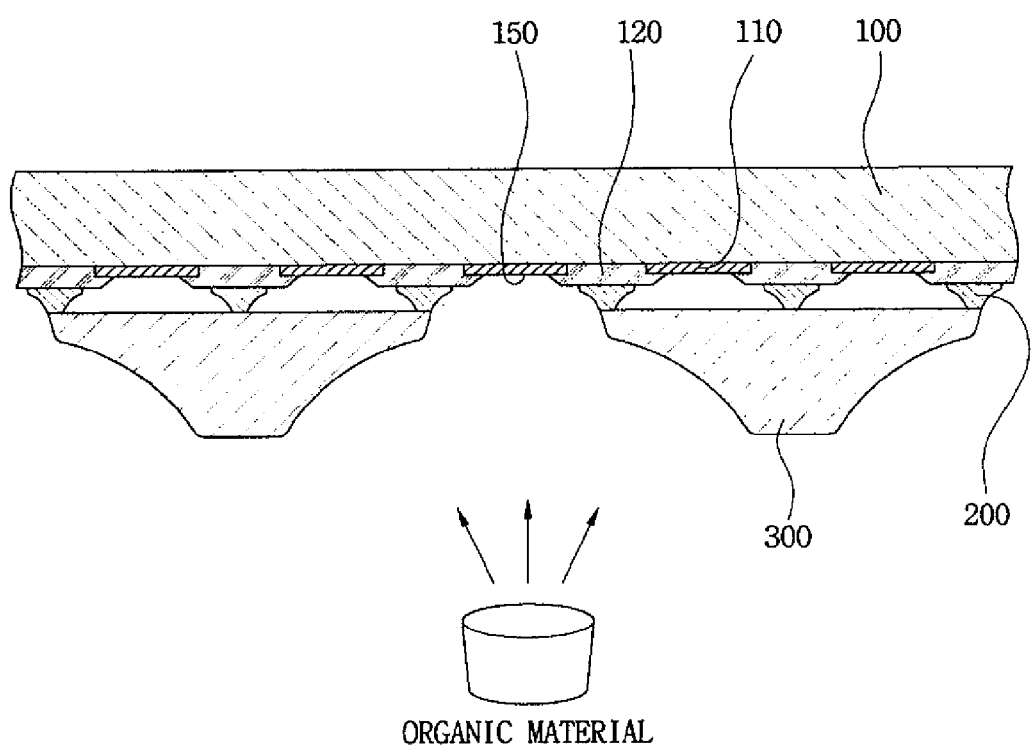
FIG. 4 illustrates a process of depositing an emission layer (EML) after a mask is mounted on an OLED according to an exemplary embodiment of the present disclosure.

FIG. 4 illustrates a process of depositing an emission layer (EML) after a mask is mounted on an OLED according to an exemplary embodiment of the present disclosure. As shown, in each of pixels 150, a first electrode 110 is shown exposed and insulating layers 120 separate R. G. and B pixels 150 from one another.

In addition, spacers 200 are shown formed on the insulating layer 120. In the embodiment shown, the spacers 200 may serve as a mounting surface for a mask 300, and thus, prevents the metal mask from impinging the pixel regions 150. For example, in order to deposit a material for organic EMLs on a target pixel region, the metal mask 300 may have an opening corresponding to the target pixel region 150. During fabrication, the metal mask 300 may be positioned on the spacers 200 such that the target pixel region is disposed opposite the material for the organic EMLs. Once position, the material for the organic EMLs is deposited to form the organic EMLs in the pixels 150.

In addition, because the spacers 200 may have portions extending crosswise and lengthwise along the pixel 150, the spacers 200 can prevent the material for organic EMLs from invading pixel regions other than a target pixel region where the material is to be deposited. Furthermore, as can be seen in FIG. 4, the spacers 200 may facilitate the mounting of the metal mask 300 and, during transportation of the metal mask 300 in the widthwise direction of the pixel region, the spacing of spacers 200 may help prevent or reduce instances where the metal mask 300 is caught or snagged.

Although the present disclosure has been described with reference to certain exemplary embodiments thereof, it will be understood by those skilled in the art that a variety of modifications and variations may be made to the present disclosure without departing from the spirit or scope of the present disclosure defined in the appended claims, and their equivalents.

What is claimed is:

1. An organic light emitting device comprising:
   a substrate;
   an insulating layer disposed over the substrate;
   an array of organic light emitting pixels disposed over the substrate, wherein each pixel is separated by the insulating layer; and
   a plurality of spacers having an area which contacts the insulating layer smaller than the area of the insulating layer which contacts the substrate disposed over the insulating layer, between each of the pixels, having portions extending between the pixels in a plurality of directions, wherein the portions extending between the pixels in a plurality of directions are positioned along a lengthwise side of the pixels and between pixels of different color and are at least as long as a length of an individual pixel;
   wherein each of the plurality of spacers comprises a different material than the insulating layer and is discrete from and does not contact the other spacers.

2. The organic light emitting device of claim 1, wherein the plurality of spacers comprises portions that are positioned along the lengthwise side of the pixels and separate portions that are positioned along another side of the pixels.

3. The organic light emitting device of claim 1, wherein the plurality of spacers comprises portions that are positioned perpendicularly relative to the portions positioned along the lengthwise side of the pixels.

4. The organic light emitting device of claim 1, wherein the spacers are configured to prevent impingement of a metal mask into the pixels while the mask is mounted on the spacers.

5. The organic light emitting device of claim 1, wherein the spacers are configured with a tapered cross section.

6. The organic light emitting device of claim 1, wherein the spacers substantially surround each of the pixels.

7. The organic light emitting device of claim 1, wherein the plurality of spacers are configured to substantially prevent organic material for a first pixel from invading into another pixel during deposition of the organic material.

8. An organic light emitting device comprising:
   a substrate;
   an insulating layer disposed over the substrate;
   an array of organic light emitting pixels disposed over the substrate; and
   a plurality of spacers having an area which contacts the insulating layer smaller than the area of the insulating layer which contacts the substrate disposed over the insulating layer, between each of the pixels, having portions extending between the pixels in a plurality of directions, wherein the portions extending between the pixels in a plurality of directions are positioned along a lengthwise side of the pixels and between pixels of different color and are at least as long as a length of an individual pixel;
   wherein each of the plurality of spacers comprises a different material than the insulating layer and is discrete from and does not contact the other spacers.

9. The organic light emitting device of claim 8, wherein the plurality of other portions of each spacer extend perpendicularly from the first portion of the spacer.

10. The organic light emitting device of claim 8, wherein the plurality of spacers are configured to prevent impingement of a metal mask into the pixels while the mask is mounted on the spacers.

11. The organic light emitting device of claim 8, wherein the plurality of spacers are configured to substantially prevent organic material for a first pixel from invading into another pixel during deposition of the organic material.

12. The organic light emitting device of claim 8, wherein the plurality of spacers substantially surround each of the pixels.

13. The organic light emitting device of claim 8, wherein the spacers are configured with a tapered cross section.

14. An organic light emitting device comprising:
   a substrate;
   an insulating layer disposed over the substrate;

an array of organic light emitting polygon-shaped pixels disposed over the substrate; and a plurality of spacers having area which contacts the insulating layer smaller than the area of the insulating layer which contacts the substrate each having portions that extend in a plurality of directions between the pixels, and wherein the portions are as long as the side of the pixel to which it is adjacent wherein each of the plurality of spacers comprises a different material than the insulating layer and is discrete from and does not contact the other spacers.

15. The organic light emitting device of claim 14, wherein the spacers are configured with a tapered cross section.

16. The organic light emitting device of claim 4, wherein the plurality of spacers substantially surround each of the pixels.

17. The organic light emitting device of claim 14, wherein the plurality of spacers are configured to substantially prevent organic material for a first pixel from invading into another pixel during deposition of the organic material.

18. The organic light emitting device of claim 14, wherein the light emitting pixels are hexagon-shaped.

* * * * *

UNITED STATES PATENT AND TRADEMARK OFFICE
CERTIFICATE OF CORRECTION

PATENT NO. : 8,350,468 B2
APPLICATION NO. : 12/489167
DATED : January 8, 2013
INVENTOR(S) : Ko et al.

It is certified that error appears in the above-identified patent and that said Letters Patent is hereby corrected as shown below:

In the Specifications:

In column 3 at line 46, change "R. G." to --R, G,--.
In column 3 at line 47, change "R. G." to --R, G,--.
In column 5 at line 17, change "R. G." to --R, G,--.
In column 5 at line 18, change "R. G." to --R, G,--.
In column 5 at line 26, change "R. G." to --R, G,--.

In the Claims:

In column 8 at line 1, in claim 16, change "4," to --14,--.

Signed and Sealed this
Ninth Day of July, 2013

Teresa Stanek Rea
*Acting Director of the United States Patent and Trademark Office*